United States Patent
Seon et al.

(10) Patent No.: US 9,312,391 B2
(45) Date of Patent: Apr. 12, 2016

(54) SOLUTION COMPOSITION FOR FORMING OXIDE SEMICONDUCTOR, AND OXIDE SEMICONDUCTOR AND ELECTRONIC DEVICE INCLUDING THE SAME

(71) Applicant: Samsung Electronics Co., Ltd., Suwon-Si, Gyeonggi-Do (KR)

(72) Inventors: Jong-baek Seon, Yongin-si (KR); Myung-kwan Ryu, Yongin-si (KR); Sang-yoon Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 262 days.

(21) Appl. No.: 14/043,324

(22) Filed: Oct. 1, 2013

(65) Prior Publication Data

US 2014/0291664 A1 Oct. 2, 2014

(30) Foreign Application Priority Data

Mar. 27, 2013 (KR) ........................ 10-2013-0032875

(51) Int. Cl.
 *H01B 1/06* (2006.01)
 *H01B 1/08* (2006.01)
 *H01L 29/786* (2006.01)

(52) U.S. Cl.
 CPC .............. *H01L 29/7869* (2013.01); *H01B 1/06* (2013.01); *H01B 1/08* (2013.01); *H01L 29/78693* (2013.01)

(58) Field of Classification Search
 CPC .............. H01B 1/00; H01B 1/06; H01B 1/08; H01L 29/7869; H01L 29/78693
 USPC ................................ 252/518.1, 519.1; 257/43
 See application file for complete search history.

(56) References Cited

U.S. PATENT DOCUMENTS

| 3,884,884 A * | 5/1975 | Scoggins et al. .............. 528/360 |
| 2001/0012678 A1 | 8/2001 | Tanaka et al. |
| 2009/0309088 A1 | 12/2009 | Sakamoto |
| 2011/0104851 A1 | 5/2011 | Akimoto et al. |
| 2011/0189818 A1 | 8/2011 | Shinn et al. |

FOREIGN PATENT DOCUMENTS

| JP | 08-008063 A | 1/1996 |
| JP | 2000-277537 A | 10/2000 |
| JP | 2005-223231 A | 8/2005 |

OTHER PUBLICATIONS

Deulkar, S. et al.: "Zinc Oxysulfide Thin Films Grown by Pulsed Laser Deposition"; Journal of Electronic Materials, vol. 39, No. 5, pp. 589-594; 2010.
Ye, Y. et al.: "High mobility amorphous zinc oxynitride semiconductor material for thin film transistors"; American Institute of Physics: Journal of Applied Physics, vol. 106, No. 074512, pp. 1-8; 2009.
Shan, W.: "Oxygen induced band-gap reduction in ZnOxSe(1—x) alloys"; Wiley-VCH: Physica Status Solidi B-Basic Research, vol. 241, Issue 3, pp. 603-606; 2004.
Kuznetsov, V. et al.: "Electronic conduction in amorphous and polycrystalline zinc-indium oxide films"; American Institute of Physics: Applied Physics Letters, vol. 97, No. 262117, pp. 1-3; 2010.
Hirose, H. et al.: "Electronic Structure of Sr2Cu2ZnO2S2 Layered Oxysulfide with CuS Layers"; American Chemical Society: Chemistry of Materials, vol. 14, pp. 1037-1041; 2002.
Schmidt, E. et al.: "Amorphous molybdenum oxysulfide thin films and their physical characterization"; Elsevier Science: Thin Solid Films, vol. 260, pp. 21-25; 1995.

* cited by examiner

Primary Examiner — Mark Kopec
Assistant Examiner — Haidung Nguyen
(74) Attorney, Agent, or Firm — Harness, Dickey & Pierce, P.L.C.

(57) ABSTRACT

A solution composition for forming an oxide semiconductor includes a metal oxide precursor, and one of a metal thioacetate and a derivative thereof.

14 Claims, 2 Drawing Sheets

SOLUTION COMPOSITION FOR FORMING OXIDE SEMICONDUCTOR, AND OXIDE SEMICONDUCTOR AND ELECTRONIC DEVICE INCLUDING THE SAME

CROSS REFERENCE TO RELATED APPLICATION

This application claims priority to and the benefit of Korean Patent Application No. 10-2013-0032875 filed in the Korean Intellectual Property Office on Mar. 27, 2013, the entire contents of which are incorporated herein by reference.

BACKGROUND

1. Field

Example embodiments provide a solution composition for forming an oxide semiconductor, an oxide semiconductor, and an electronic device including the oxide semiconductor.

2. Description of the Related Art

Electronic devices, for example, a resistor, a capacitor, a diode, and a thin film transistor, are applied in various fields. In particular, the thin film transistor (TFT) is used as a switching device or a driving device in a display device, for example, a liquid crystal display (LCD), an organic light emitting diode (OLED) device, and an electrophoretic display.

In such an electronic device, a semiconductor determines device characteristics. Silicon (Si) has mostly been used as a semiconductor in an electronic device. The silicon is classified into amorphous silicon and polycrystalline silicon depending on its crystal form, and the amorphous silicon requires a relatively simple manufacturing process but has lower charge mobility and limits in manufacturing a relatively high performance device, while the polycrystalline silicon has higher charge mobility but requires a crystallization process of silicon, which leads to higher costs and a relatively complex process.

An oxide semiconductor may be used to replace amorphous silicon and polycrystalline silicon having the above disadvantages. However, because it is difficult to control electrical characteristics of the oxide semiconductor, stability and reliability of an electronic device including the oxide semiconductor may be deteriorated.

SUMMARY

Example embodiments provide a solution composition for forming an oxide semiconductor that may improve electrical characteristics of an electronic device. Example embodiments also provide an oxide semiconductor formed from the solution composition. Example embodiments also provide an electronic device including the oxide semiconductor.

According to example embodiments, a solution composition for forming an oxide semiconductor includes a metal oxide precursor, and one of a metal thioacetate and a derivative thereof.

The metal oxide precursor and the one of the metal thioacetate and the derivative thereof include a first metal, the first metal including at least one selected from zinc (Zn), indium (In), magnesium (Mg), molybdenum (Mo), hafnium (Hf), tantalum (Ta), cerium (Ce), lanthanum (La), silicon (Si), germanium (Ge), vanadium (V), niobium (Nb), yttrium (Y), tin (Sn), gallium (Ga), and titanium (Ti).

The one of the metal thioacetate and the derivative thereof may be included in a lesser amount than the metal oxide precursor.

The metal oxide precursor and the one of the metal thioacetate and the derivative thereof may be included in a mole ratio of greater than or equal to about 1:0.01 and less than about 1:1.

The metal oxide precursor and the one of the metal thioacetate and the derivative thereof may be included in a mole ratio of greater than or equal to about 1:0.1 and less than or equal to about 1:0.5.

The metal oxide precursor and the one of the metal thioacetate and the derivative thereof may be included in a mole ratio of greater than or equal to about 1:0.1 and less than or equal to about 1:0.25.

The metal oxide precursor may include at least one selected from a metal acetate, a metal hydroxide, a metal alkoxide, a metal citrate, a metal carbonate, a metal (meth) acrylate, a metal nitrate, a metal acetylacetonate, a metal halide, a metal thiocarbamate, a metal sulfonate, a metal undecylate, a metal borate, and hydrates thereof.

The solution composition may further include at least one selected from an alcohol amine compound, an alkyl ammonium hydroxy compound, an alkyl amine compound, a ketone compound, an acid compound, a base compound, and deionized water.

According to example embodiments, an oxide semiconductor includes the solution composition.

The oxide semiconductor may be a metal oxysulfide. The oxide semiconductor may have at least one amorphous portion.

According to example embodiments, an electronic device includes the oxide semiconductor.

The oxide semiconductor may be a metal oxysulfide. The oxide semiconductor may have at least one amorphous portion.

According to example embodiments, an electronic device includes the oxide semiconductor.

The electronic device may include a thin film transistor, and the thin film transistor may include a gate electrode overlapping the oxide semiconductor, a source electrode electrically connected to the oxide semiconductor, and a drain electrode electrically connected to the semiconductor, the drain electrode facing the source electrode.

DETAILED DESCRIPTION

Figure 1:
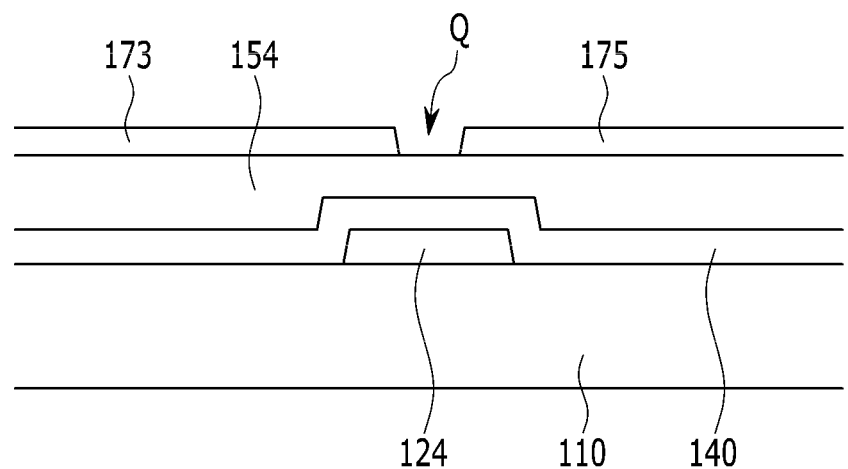
FIG. 1 is a cross-sectional view showing a thin film transistor according to example embodiments.

Example embodiments will hereinafter be described in detail, and may be more easily performed by those who have common knowledge in the related art. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Parts having no relationship with the description are omitted for clarity, and the same or similar constituent elements are indicated by the same reference numerals throughout the specification.

It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

Hereinafter, a solution composition according to example embodiments is described. The solution composition according to example embodiments is a precursor solution used for forming an oxide semiconductor.

The solution composition according to example embodiments includes a metal oxide precursor and a metal thioacetate or a derivative thereof (hereinafter referred to as "metal thioacetate").

The metal oxide precursor and metal thioacetate may include a first metal, respectively, and the first metal may be at least one selected from, for example, zinc (Zn), indium (In), magnesium (Mg), molybdenum (Mo), hafnium (Hf), tantalum (Ta), cerium (Ce), lanthanum (La), silicon (Si), germanium (Ge), vanadium (V), niobium (Nb), yttrium (Y), tin (Sn), gallium (Ga), and titanium (Ti). However, the first metal is not limited thereto, and the metal for forming a metal oxide is not limited.

The metal oxide precursor may include at least one selected from, for example, a metal acetate, a metal hydroxide, a metal alkoxide, a metal citrate, a metal carbonate, a metal (meth)acrylate, a metal nitrate, a metal acetylacetonate, a metal halide, a metal thiocarbamate, a metal sulfonate, a metal undecylate, a metal borate, and hydrates thereof, but is not limited thereto.

The metal thioacetate prevents or inhibits crystalline formation of the metal oxide obtained from the metal oxide precursor, and allows at least one portion of the metal oxide to remain amorphous.

The metal thioacetate may be included in a lesser amount than the metal oxide precursor. For example, the metal oxide precursor, and the metal thioacetate or derivative thereof, may be included in a mole ratio of greater than or equal to about 1:0.01 and less than 1:1, and for another example, in a mole ratio of greater than or equal to about 1:0.1 and less than or equal to about 1:0.5. When the metal oxide precursor and the metal thioacetate are used within the ratio, the metal oxide may have semiconductor characteristics and still prevent or reduce crystalline formation. Within the ranges, the metal oxide precursor, and the metal thioacetate or derivative thereof, may be included in a mole ratio of greater than or equal to about 1:0.1 and less than or equal to about 1:0.25.

The metal oxide precursor and the metal thioacetate may be included in each amount of about 0.01 to about 30 wt % based on the total amount of the solution composition. Solubility may be ensured within the range.

The solution composition may further include a solution stabilizer. The solution stabilizer may include one or more selected from an alcohol amine compound, an alkyl ammonium hydroxy compound, an alkyl amine compound, a ketone compound, an acid compound, a base compound, and deionized water, for example one or more selected from monoethanol amine, diethanolamine, triethanolamine, monoisopropylamine, N,N-methylethanol amine, aminoethyl ethanol amine, diethylene glycol amine, 2-(aminoethoxy)ethanol, N-t-butylethanolamine, N-t-butyldiethanolamine, tetramethylammonium hydroxide, methylamine, ethylamine, acetylacetone, hydrochloric acid, nitric acid, sulfuric acid, acetic acid, ammonium hydroxide, potassium hydroxide, and sodium hydroxide.

The solution stabilizer may improve solubility of other components in the solution composition. Accordingly, a thin film formed from the solution composition may be uniformly formed. An amount of the solution stabilizer may be different depending on kinds and amounts of the above-described components, and may be included in an amount of about 0.01 to about 30 wt % based on the total amount of the solution composition. When the solution stabilizer is included within the above range, solubility and thin film coating properties may be improved.

The metal oxide precursor, the metal thioacetate, and the solution stabilizer may be mixed in a solvent to prepare a solution composition. Herein, each solution including the metal oxide precursor and the metal thioacetate in each solvent may be mixed. The solution stabilizer may be added to a solution of each component, or may be added after mixing each solution. In addition, the metal oxide precursor, the metal thioacetate, and the solution stabilizer are mixed in a solvent to prepare a solution composition.

Herein, the solvent may be any solvent that may dissolve the above-described components, without limitation, and may be one or more selected from, for example, deionized water, methanol, ethanol, propanol, isopropanol, 2-methoxyethanol, 2-ethoxyethanol, 2-propoxyethanol 2-butoxyethanol, methylcellosolve, ethylcellosolve, diethylene glycol methyl ether, diethylene glycol ethylether, dipropylene glycol methylether, toluene, xylene, hexane, heptane, octane, ethylacetate, butylacetate, diethylene glycol dimethylether, diethylene glycol dimethyl ethylether, methyl ethoxy propionate, ethyl ethoxy propionate, ethyl lactate, propylene glycol methyl ether acetate, propylene glycol methyl ether, propylene glycol propyl ether, methyl cellosolve acetate, ethyl cellosolve acetate, diethylene glycol methyl acetate, diethylene glycol ethyl acetate, acetone, methyl isobutyl ketone, cyclohexanone, dimethylformamide (DMF), N,N-dimethylacetamide (DMAc), N-methyl-2-pyrrolidone, γ-butyrolactone, diethylether, ethylene glycol dimethyl ether, diglyme, tetrahydrofuran, acetylacetone, and acetonitrile.

The solvent may be included in a balance amount excluding the above-described components based on the total amount of the solution composition.

The metal oxide precursor may be a precursor of a metal oxide and the metal thioacetate is a precursor of a metal sulfide, and they may form a metal oxysulfide through heat treatment which will be described thereafter.

The metal oxysulfide may be an oxide semiconductor, and the oxide semiconductor may have at least one amorphous portion due to the metal sulfide formed from the metal thioacetate.

In this way, an oxide semiconductor is formed using a solution, and thereby a manufacturing process may be simplified without performing a relatively complicated and high-cost process, for example, vacuum deposition.

The oxide semiconductor may be used in an active layer of an electronic device, for example, a thin film transistor.

Hereinafter, a thin film transistor using the oxide semiconductor as an active layer is described referring to drawings.

FIG. 1 is a cross-sectional view showing a thin film transistor according to example embodiments. Referring to FIG. 1, a thin film transistor according to example embodiments includes a gate electrode 124 formed on a substrate 110, and a gate insulation layer 140 covering the entire surface of the substrate on a gate electrode 124.

An oxide semiconductor 154 is formed on the gate insulating layer 140 overlapping the gate electrode 124. As described above, the oxide semiconductor 154 may be made of a metal oxysulfide formed from the solution composition including the metal oxide precursor and metal thioacetate.

The oxide semiconductor 154 may be an amorphous and/or nanocrystalline semiconductor, and may have at least one amorphous portion. Accordingly, stability deterioration of device characteristics due to a crystalline grain boundary may be prevented or reduced, and thus characteristics of a thin film transistor may be improved.

A source electrode 173 and a drain electrode 175 facing each other are formed on the oxide semiconductor 154. The source electrode 173 and drain electrode 175 are electrically connected to the oxide semiconductor 154 during turn-on. Herein, a channel (Q) of the thin film transistor is formed in the oxide semiconductor 154 between the source electrode 173 and drain electrode 175.

Hereinafter, a method of manufacturing the thin film transistor of FIG. 1 is described referring to FIGS. 2 to 4 as well as FIG. 1.

Figure 2:
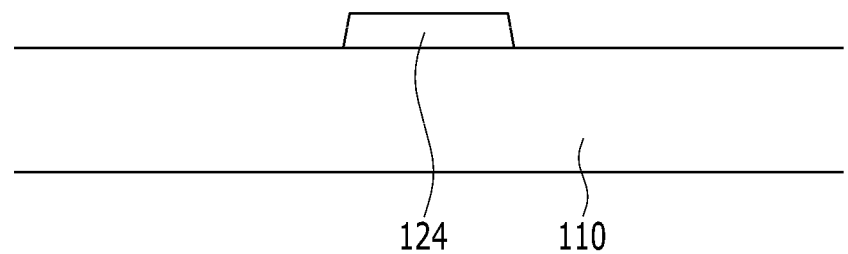
FIGS. 2 to 4 are cross-sectional views sequentially showing processes of manufacturing the thin film transistor of FIG. 1.
Figure 3:
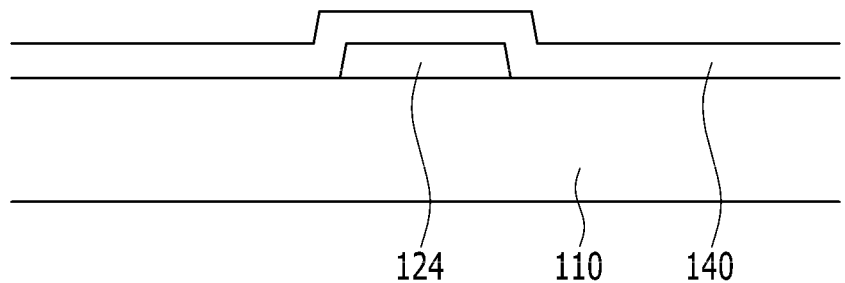
Figure 4:
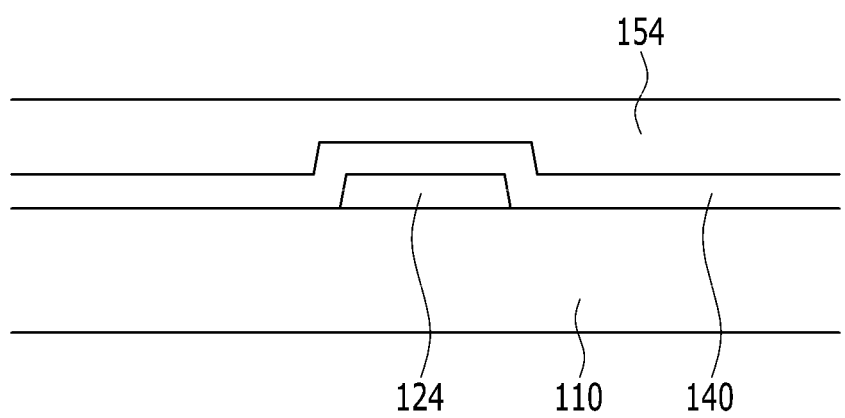

FIGS. 2 to 4 are cross-sectional views sequentially showing processes of manufacturing the thin film transistor of FIG. 1.

Before manufacturing a thin film transistor, the metal oxide precursor, metal thioacetate, and solution stabilizer are mixed in a solvent to prepare a solution composition. Herein, after each component is mixed in a solvent, the obtained solution composition may be agitated at a temperature, for example, ranging from room temperature (about 25° C.) to about 100° C., for about 1 minute to about 100 hours by using an agitator or ultrasonic waves. The agitation may improve dissolution and thin film coating. Then, an aging step may be performed for about 1 minute to about 240 hours. The solution composition resultant may be in a sol state.

Referring to FIG. 2, the gate electrode 124 is formed by stacking a conductive layer on a substrate 110 made of glass, silicon, or plastic, and performing photolithography.

Referring to FIG. 3, the gate insulating layer 140 is formed by stacking silicon oxide ($SiO_2$), silicon nitride ($SiN_x$), or an organic insulation layer on the gate electrode 124.

Referring to FIG. 4, the oxide semiconductor 154 is formed on the gate insulating layer 140. The oxide semiconductor 154 may be formed by coating and heat-treating the above-described solution composition.

The coating of the solution composition may be performed using a method of, for example, spin coating, slit coating, inkjet printing, spraying, dipping, roll-to-roll coating, or nano-imprinting.

The heat treatment may be performed at a temperature ranging from about 50 to about 1000° C., and may be repeated more than once at the same or a different temperature. For example, the heat treatment may be performed by prebaking the solution composition at a relatively low temperature of about 50 to about 300° C. to change the solution composition from a sol to a gel, and then baking the gel at a relatively high temperature of about 300 to about 1000° C. to form an oxide semiconductor.

Referring to FIG. 1, the source electrode 173 and the drain electrode 175 are formed by stacking a conductive layer on the oxide semiconductor 154 and then performing photolithography.

Hereinafter, the present disclosure is illustrated in more detail with reference to examples. However, these are examples, and the present disclosure is not limited thereto.

Preparation Of Solution Composition

Preparation Example 1

A zinc oxide precursor solution is prepared by mixing zinc acetate dianhydride to a concentration of 0.35 M in 2-methoxyethanol and adding 4 equivalents of ethanol amine based on 1 equivalent of the zinc acetate dianhydride.

A zinc thioacetate derivative solution is prepared by mixing $Zn(SOCCH_3)_2Lut_2$ (zinc thioacetate dilutidine) to a concentration of 0.2 M in 2-methoxyethanol and adding 4 equivalents of ethanolamine based on 1 equivalent of the $Zn(SOCCH_3)_2Lut_2$.

The zinc oxide precursor solution is mixed with the zinc thioacetate derivative solution at a mole ratio of 1:0.1, preparing a solution composition.

Preparation Example 2

A solution composition is prepared according to the same method as Preparation Example 1, except for mixing the zinc oxide precursor solution and the zinc thioacetate derivative solution at a mole ratio of 1:0.25.

Comparative Preparation Example 1

A solution composition is prepared according to the same method as Preparation Example 1, except for only using the zinc oxide precursor solution instead of mixing the zinc oxide precursor solution with the zinc thioacetate derivative solution.

Manufacture of Thin Film Transistor

Example 1

A gate insulating layer is formed by thermally depositing a 3000 Å-thick oxide film on a P$^{++}$ doped silicon wafer. The solution composition according to Preparation Example 1 is spin-coated on the gate insulating layer and then prebaked. Herein, the spin-coating is performed at a speed of 3000 rpm for 30 seconds, and the prebaking is performed on a hot plate at 300° C. for 30 minutes. Next, the obtained substrate is heat-treated on a hot plate at 450° C. for 30 minutes to grow a zinc oxysulfide (ZnOS) semiconductor thin film. Then, a 700 Å-thick aluminum (Al) layer is stacked using a shadow mask, forming a source electrode and a drain electrode.

Example 2

A thin film transistor is manufactured according to the same method as Example 1, except for using the solution composition according to Preparation Example 2 instead of the solution composition according to Preparation Example 1.

Comparative Example 1

A thin film transistor is manufactured according to the same method as Example 1, except for using the solution composition according to Comparative Preparation Example 1 instead of the solution composition according to Preparation Example 1.

Evaluation

Current characteristics of the thin film transistors according to Examples 1 and 2 and Comparative Example 1 are evaluated.

The results are provided in Table 1.

TABLE 1

|  | Current ratio ($I_{on}/I_{off}$) |
| --- | --- |
| Example 1 | $1.43 \times 10^2$ |
| Example 2 | $5.04 \times 10$ |
| Comparative Example 1 | $3.70 \times 10$ |

Referring to Table 1, the thin film transistors according to Examples 1 and 2 show improved current characteristics compared with the thin film transistor according to Comparative Example 1.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. A composition for forming an oxide semiconductor, comprising:
   a metal oxide precursor; and
   one of a metal thioacetate and a derivative thereof,
   wherein the metal oxide precursor and the one of the metal thioacetate and the derivative thereof include a first metal, the first metal including at least one selected from zinc (Zn), indium (In), magnesium (Mg), molybdenum (Mo), hafnium (Hf), tantalum (Ta), cerium (Ce), lanthanum (La), silicon (Si), germanium (Ge), vanadium (V), niobium (Nb), yttrium (Y), tin (Sn), gallium (Ga), and titanium (Ti).

2. The composition of claim 1, wherein the one of the metal thioacetate and the derivative thereof is included in a lesser amount than the metal oxide precursor.

3. The composition of claim 1, wherein the metal oxide precursor and the one of the metal thioacetate and the derivative thereof are included in a mole ratio of greater than or equal to about 1:0.01 and less than 1:1.

4. The composition of claim 3, wherein the metal oxide precursor and the one of the metal thioacetate and the derivative thereof are included in a mole ratio of greater than or equal to about 1:0.1 and less than or equal to about 1:0.5.

5. The composition of claim 3, wherein the metal oxide precursor and the one of the metal thioacetate and the derivative thereof are included in a mole ratio of greater than or equal to about 1:0.1 and less than or equal to about 1:0.25.

6. The composition of claim 1, wherein the metal oxide precursor includes at least one selected from a metal acetate, a metal hydroxide, a metal alkoxide, a metal citrate, a metal carbonate, a metal (meth)acrylate, a metal nitrate, a metal acetylacetonate, a metal halide, a metal thiocarbamate, a metal sulfonate, a metal undecylate, a metal borate, and hydrates thereof.

7. The composition of claim 1, further comprising:
   at least one selected from an alcohol amine compound, an alkyl ammonium hydroxy compound, an alkyl amine compound, a ketone compound, an acid compound, a base compound, and deionized water.

8. An oxide semiconductor comprising the composition according to claim 1.

9. The oxide semiconductor of claim 8, wherein the oxide semiconductor is a metal oxysulfide.

10. The oxide semiconductor of claim 9, wherein the oxide semiconductor has at least one amorphous portion.

11. An electronic device comprising the oxide semiconductor according to claim 8.

12. The electronic device of claim 11, wherein the oxide semiconductor is a metal oxysulfide.

13. The electronic device of claim 11, wherein the oxide semiconductor has at least one amorphous portion.

14. The electronic device of claim 11, wherein the electronic device is a thin film transistor, the thin film transistor including,
   a gate electrode overlapping the oxide semiconductor;
   a source electrode electrically connected to the oxide semiconductor; and
   a drain electrode electrically connected to the oxide semiconductor, the drain electrode facing the source electrode.

* * * * *